United States Patent [19]

Nazarian et al.

[11] Patent Number: 5,859,803
[45] Date of Patent: Jan. 12, 1999

[54] NON-VOLATILE CIRCUIT THAT DISABLES FAILED DEVICES

[75] Inventors: Hagop Nazarian, San Jose; David Sowards, Fremont; Lawrence D. Engh, Redwood City; Jung Sheng Hoei, Newark; May Lee, San Jose, all of Calif.

[73] Assignee: Information Storage Devices, Inc., San Jose, Calif.

[21] Appl. No.: 925,020

[22] Filed: Sep. 8, 1997

[51] Int. Cl.⁶ .............................. G11C 7/00; H01L 21/00
[52] U.S. Cl. ........................................ 365/201; 371/22.5
[58] Field of Search .............................. 365/201, 230.01; 371/10.1, 10.2, 22.5

[56] References Cited

U.S. PATENT DOCUMENTS

| | | | |
|---|---|---|---|
| 5,388,064 | 2/1995 | Khan . | |
| 5,442,642 | 8/1995 | Ingalls et al. | 371/22.5 |
| 5,617,531 | 4/1997 | Crouch et al. | 395/183.06 |
| 5,638,331 | 6/1997 | Cha et al. | 365/201 |
| 5,654,204 | 8/1997 | Anderson | 438/15 |
| 5,708,624 | 11/1998 | Leung | 365/233 |

*Primary Examiner*—Viet Q. Nguyen
*Attorney, Agent, or Firm*—Blakely, Sokoloff, Taylor & Zafman LLP

[57] ABSTRACT

The present invention discloses a circuit for controlling operation of a functional circuit in a device based on a test result during testing. The circuit comprises a first storage element configured to be in one of a first state and a second state according to the test result, and a first sensing element coupled to the first storage element for generating a first signal used to control the operation of the functional circuit.

24 Claims, 4 Drawing Sheets

NON-VOLATILE CIRCUIT THAT DISABLES FAILED DEVICES

BACKGROUND OF THE INVENTION

1. Field of the Invention

The present invention generally relates to testing circuit. In particular, the present invention relates to a circuit to control operation of a functional circuit based on a test result.

2. Description of the Related Art

Semiconductor fabricated integrated circuits (IC) typically undergo three separate test cycles before die separation: (1) in process testing, such as continuous monitoring of sheet resistivities, junction depths, and other pertinent device parameters, such as current gain and voltage breakdown; (2) a preliminary electrical testing called the wafer-probe or the wafer-sort test performed prior to the scribing and the die-separation steps; and (3) a detailed testing of all pertinent circuit parameters after the completion of the assembly and the packaging operations.

The wafer-probe test, also called the wafer-sort operation, takes place after the wafer processing is completed. It is then followed by the die-separation (scribing) where the water is cut apart and each die is physically separated. These tests are usually made with multi-probe instruments which have adjustable probes to contact the bonding pads of the die to be tested. Each individual die undergoes a number of basic electrical tests. If found defective, it is marked with an ink marker for identification, to be discarded after the die-separation step. In this manner, each and every die on the wafer gets tested prior to the start of the assembly operation.

The wafer-sort testing step and the assembly step may or may not take place at the same manufacturing facility Customers may purchase wafers after the wafer-sort testing and performs the assembly operations to build the separated dice into their products. In the assembly process, failed dice may be erroneously introduced into the product either as a result of the non-inking or assembly process or any other reason. As a result, dice that failed operational specifications may be used in a product resulting in a high product failure rate. A high product failure rate increases the costs associated with returned products.

Accordingly, there is a need in the technology of IC testing to prevent a bad die from being used when integrated into a product.

SUMMARY OF THE INVENTION

The present invention discloses a circuit for controlling operation of a functional circuit in a device based on a test result during testing. The circuit comprises a first storage element configured to be in one of a first state and a second state according to the test result, and a first sensing element coupled to the first storage element for generating a first signal used to control the operation of the functional circuit.

BRIEF DESCRIPTION OF THE DRAWINGS

The advantages of the present invention will become more readily apparent to those ordinarily skilled in the art after reviewing the following detailed description and accompanying drawings, wherein.

DETAILED DESCRIPTION OF THE INVENTION

The present invention discloses a circuit to control operation of a functional circuit in a device that fails test criteria. The present invention offers a solution to reduce costs associated with the returned products.

In the following description, for purposes of explanation, numerous details are set forth in order to provide a thorough understanding of the present invention. However, it will be apparent to one skilled in the art that these specific details are not required in order to practice the present invention. In other instances, well known electrical structures and circuits are shown in block diagram form in order not to obscure the present invention unnecessarily.

Figure 1:
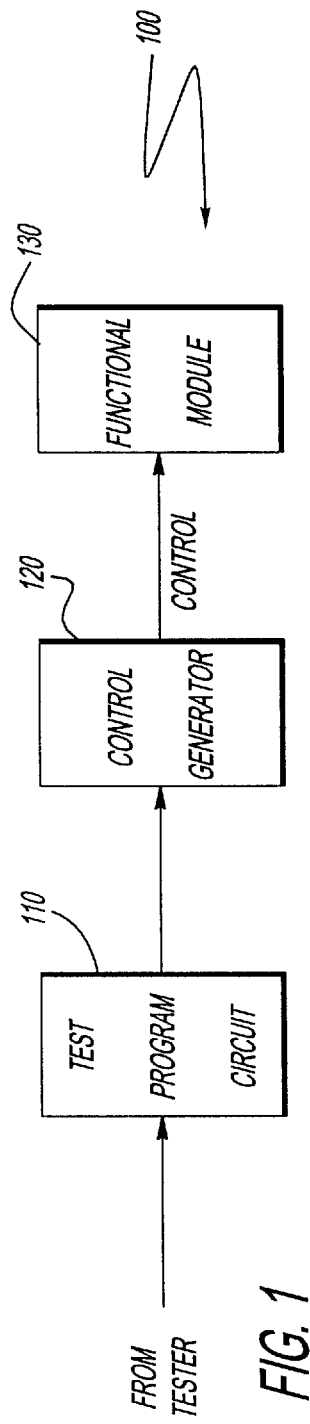
FIG. 1 is a block diagram illustrating one embodiment of a circuit utilizing the teachings of the present invention.

Referring to FIG. 1, a block diagram illustrating one embodiment of a circuit system that utilizes the teachings of the present invention is shown. The circuit system 100 includes a test program circuit 110, a control generator 120 and a functional circuit 130.

The test program circuit 110 includes circuitry that provides the execution of a test sequence during the wafer-sort level test. The test program circuit 110 may be an external test device, a tester, that is used to test the wafer, or a built-in test circuit. The test sequence executed by the test program circuit 110 typically determines if the device under test satisfies the testing criteria. The testing criteria are the performance criteria to satisfy the product specifications. The test sequence may be executed by a general purpose microprocessor or a processor specially designed to perform the testing. The test program circuit 100 also includes circuitry to provide operations that configure the control generator 120 according to the test results.

The control generator 120 includes circuitry that receives the configuration signals form the test program circuit 110 and generates a control signal to control the operation of a functional circuit in the device under test. Controlling the operation of the functional circuit includes disabling or enabling functions. In the embodiment described in the following, the control signal is used to disable the functional module. The functional circuit 130 receives the control signal generated by the control generator 120 to enable the intended function. The functional circuit is any circuit or module whose functioning needs to be controlled according to the device test results. For example, the functional circuit 130 may be a power-on circuit that allows power to pass to all major functional blocks in the device. Disabling the generation of power will prevent a failed device from powering up. In another example, the functional circuit 130 may be a speaker driver amplifier that provides an output signal from an analog playback circuit. Disabling the speaker driver amplifier will prevent the playback circuit from passing the output signal to the speaker.

Figure 2:
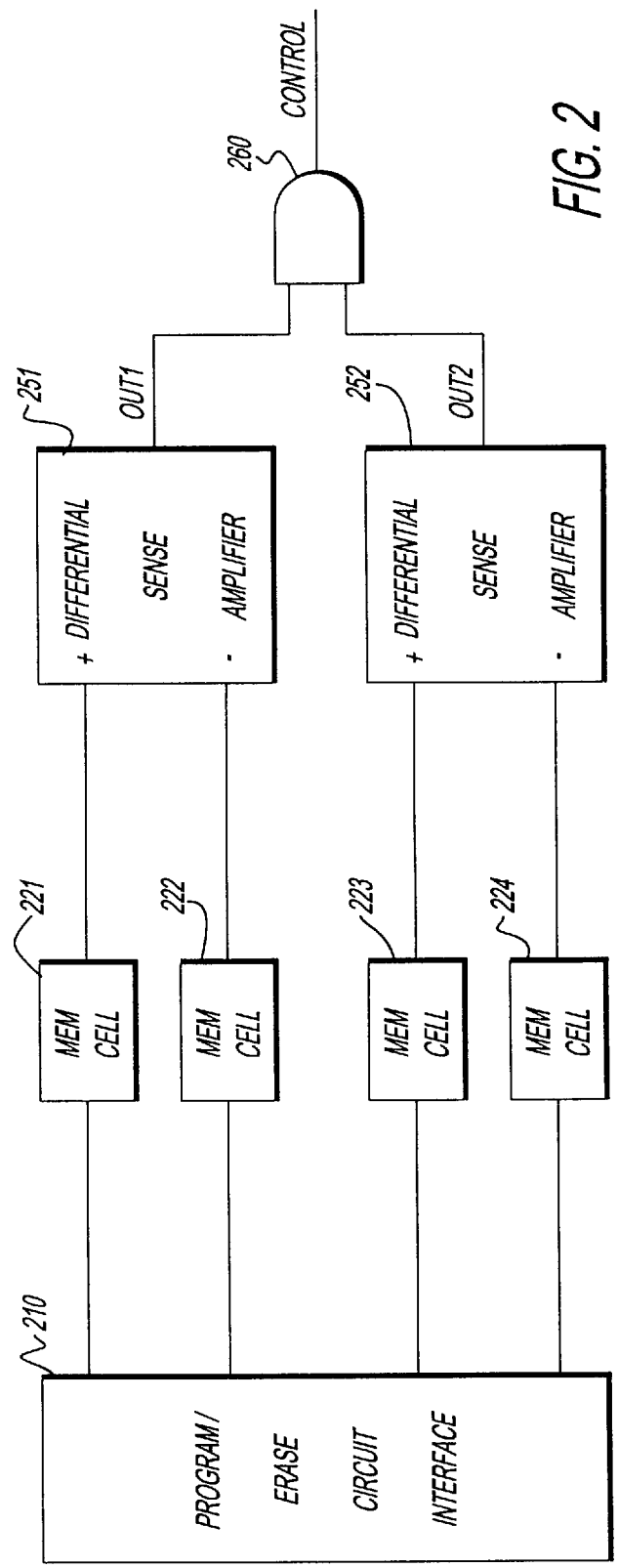
FIG. 2 is a block diagram illustrating one embodiment of the present invention.

Referring to FIG. 2, a block diagram illustrating one embodiment of the control generator 120 is shown. The control generator 120 includes a program/erase interface 210, a first non-volatile memory cell 221, a second non-volatile memory cell 222, a third non-volatile memory cell 223, a fourth non-volatile memory cell 224, a first differential sense amplifier (DSA1) 251, a second DSA2 252, and an AND gate 260.

The program/erase interface 210 is a circuit that provides an interface to the test program circuit 110 to program and erase the non-volatile cells 221, 222, 223, and 224. The non-volatile memory cells 221, 222, 223, and 224 are memory cells that can be programmed to be at one logic level and erased to be at another logic level. These memory cells are non-volatile, i.e., their state remains unchanged even when power is removed. The programming and erasing of the memory cells 221, 222, 223, and 224, are performed by the test program circuit 110 during the testing according to the test results to be described later.

The use of a differential sense amplifier for a pair of memory cells in this embodiment provides a better margin for triggering the correct state against electrical variations. These variations included cell-to-cell variations, power supply load conditions, and supply fluctuations due to transient conditions. As will be shown later, a single ended sense amplifier and a single memory cell can be used.

The positive terminal of the DSA1 251 is connected to the memory cell 221. The negative terminal of the DSA1 251 is connected to the memory cell 222. The output of the DSA1 251 is an out1 signal. The DSA1 251 generates a logic HIGH on the out1 signal if the memory cell 221 is at the programmed state and the memory cell 222 is at the erased state. The DSA1 251 generates a logic low on the out1 signal if the memory cell 221 is at the erased state or the memory cell 222 is at the programmed state. As will be shown later, a logic HIGH on the out1 signal corresponds to a failed device.

Similarly, the positive terminal of the DSA2 252 is connected to the memory cell 223. The negative terminal of the DSA2 252 is connected to the memory cell 224. The output of the DSA2 252 is an out2 signal. The DSA2 252 generates a logic HIGH on the out1 signal if the memory cell 223 is at the programmed state and the memory cell 224 is at the erased state. The DSA2 252 generates a logic low on the out2 signal if the memory cell 223 is at the erased state or the memory cell 224 is at the programmed state. As in DSA1, a logic HIGH on the out2 signal corresponds to a failed device.

The AND gate 260 receives the out1 signal and the out2 signal to produce the control signal. The control signal is used to control the operation of the functional circuit 130 or device. The control signal is asserted HIGH when both the out1 and out2 signals are HIGH. The use of two cells with a differential pair is to have better margin to trigger the correct state against variations between cell to cell, power supply value, and power supply transient conditions. It is possible to use only one DSA. In this single DSA configuration, the AND gate 260 may not be needed and the output of the DSA can be used as the control output signal.

At the beginning of the testing, the test program circuit 110 erases the memory cells 221, 222, 223, and 224 to put these memory cells in a default mode. This default mode represents a functional state of the device. During testing, if the device does not satisfy the testing criteria, the test program circuit 110 programs the memory cell 221 and the memory cell 223 leaving the memory cells 222 and 224 in the erased state. On the other hand, if the device satisfies the testing criteria, i.e., it passes the test, all the memory cells 221, 222, 223, and 224 are left in the erased state, or in a specific pattern that is different from the pattern for the failure test. For example, the pass pattern may be complementary to the failure pattern.

The AND gate 260 receives the out1 signal and the out2 signal. If both the out1 signal and the out2 signal are at logic HIGH, and AND gate 260 generates a logic HIGH on the control signal. Otherwise, the AND gate 260 generates a logic low on the control signal. After the testing, a logic HIGH on the control signal indicates that the device fails the test criteria and the corresponding functional module is disabled. A logic LOW on the control signal indicates that the device passes the test criteria and the corresponding functional module is allowed to perform its intended function. The functional module may be the entire device or any major portion of that device.

The states of the memory cells 221, 222, 223, 224, out1 signal, out2 signal, and the control signal as a function of the test results are summarized in Table 1 where:

P=programmed
E=erased
H=logic HIGH
L=logic LOW

In Table 1, State 10 is the only state that produces a logic HIGH on the control output indicating that the device fails the test. All other states represent a pass condition.

It should be appreciated by one of ordinary skill in the art that the above states can be modified to accommodate other configurations. For example, the AND gate 260 can be replaced by a NAND gate so that the active level of the failure condition at the control signal is LOW instead of HIGH. The corresponding functional module including the device should use the control signal accordingly in enabling or disabling its function.

TABLE 1

| STATE | MEMORY CELL 221 | MEMORY CELL 222 | MEMORY CELL 223 | MEMORY CELL 224 | OUT1 SIGNAL | OUT2 SIGNAL | DISABLE |
| --- | --- | --- | --- | --- | --- | --- | --- |
| 0 | E | E | E | E | L | L | L |
| 1 | E | E | E | P | L | L | L |
| 2 | E | E | P | E | L | H | L |
| 3 | E | E | P | P | L | L | L |
| 4 | E | P | E | E | L | L | L |
| 5 | E | P | E | P | L | L | L |
| 6 | E | P | P | E | L | H | L |
| 7 | E | P | P | P | L | L | L |
| 8 | P | E | E | E | H | L | L |
| 9 | P | E | E | P | H | L | L |
| 10 | P | E | P | E | H | H | H |
| 11 | P | E | P | P | H | L | L |
| 12 | P | P | E | E | L | L | L |
| 13 | P | P | E | P | L | L | L |
| 14 | P | P | P | E | L | H | L |
| 15 | P | P | P | P | L | L | L |

Figure 3:
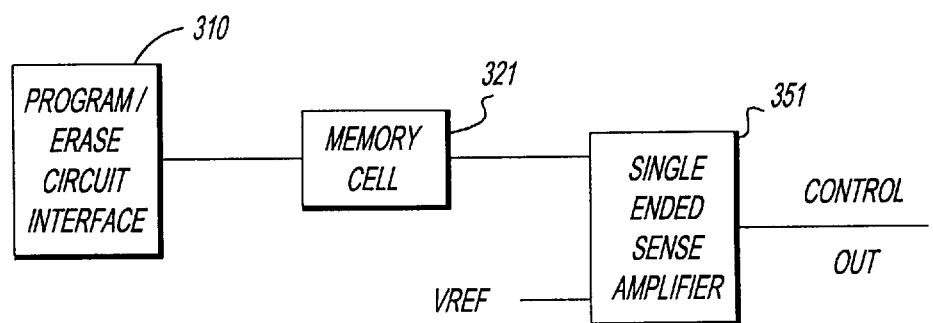
FIG. 3 is a block diagram illustrating another embodiment of the present invention.

Referring to FIG. 3, a circuit diagram illustrating another embodiment of the control generator 120 is shown. In this embodiment, the control generator 120 includes a program/erase interface 310, a non-volatile memory cell 321, and a single-ended sense amplifier 351.

The program/erase interface 310 is a circuit that provides an interface to the test program circuit 110 to program and erase the non-volatile cell 321. The non-volatile memory cell 321 is a memory cell that can be programmed to be at one logic level and erased to be at another logic level. This memory cell is non-volatile, i.e., its state remains unchanged even when power is removed. The programming and erasing of the memory cell 321 are performed by the test program circuit 110 during the testing.

The single-ended sense amplifier 351 has one terminal which is connected to the output of the memory cell 321. The voltage at this terminal is compared with a fixed voltage source, a reference voltage, and an output signal is generated according to the result of this comparison.

In this embodiment, only one sense amplifier is used. Therefore, the output of the sense amplifier can be used as the disable output signal.

Other embodiments are possible. For example, more than one memory cell and more than one sense amplifier can be used to increase redundancy and reduce probability of a field reliability failure. In that case, a multiple input AND gate should be used to combine the outputs of all the sense amplifiers to generate the control output signal.

Figure 4:
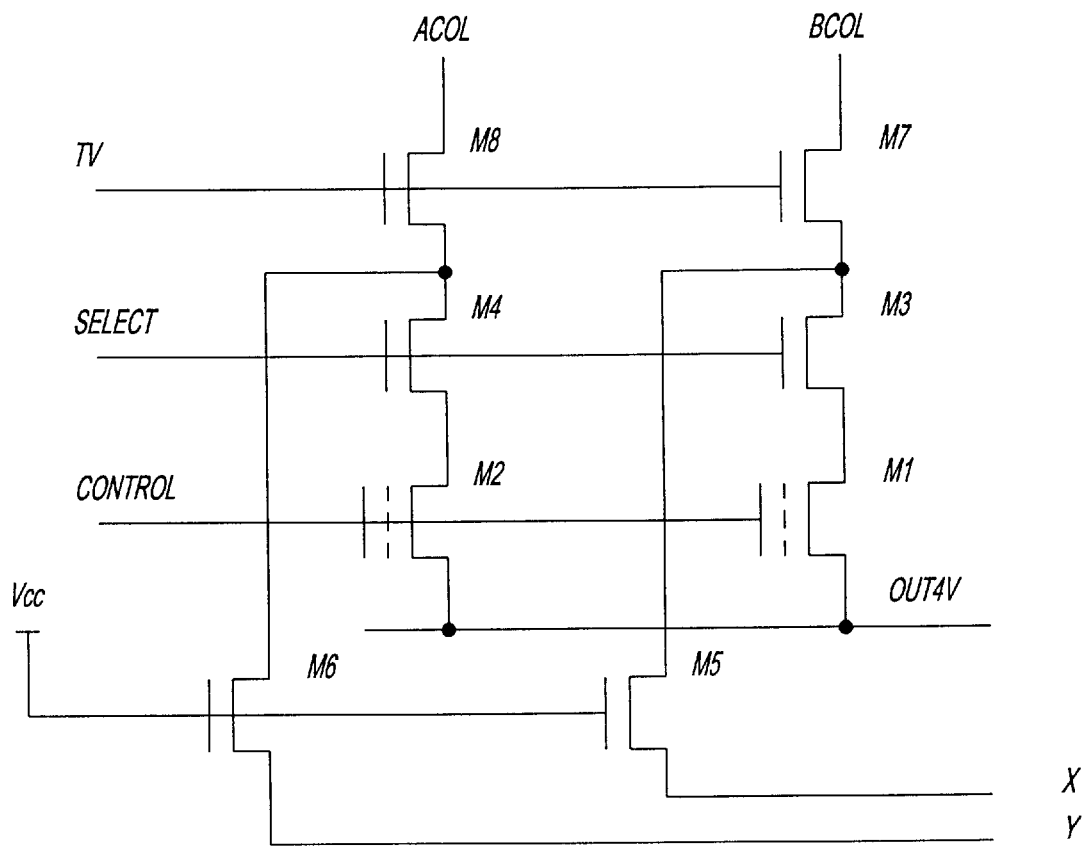
FIG. 4 is a circuit diagram illustrating one embodiment of the non-volatile memory cells.

Referring to FIG. 4, a simplified circuit diagram illustrating one embodiment of the non-volatile memory cells 221 and 222 and the interface 210 is shown. As is shown in FIG. 4, the memory cell 221 (or 222) is the same as the memory cells 221, 222, 223, 224 in FIG. 2 and 321 in FIG. 3. For clarity, only two memory cells are shown in FIG. 4.

The memory cell 221 includes a non-volatile cell M1 and a select transistor M3. The pass transistor M5 provides the output path for the memory cell 221 to the output terminal X. The pass transistor M7 provides the electrical path for the programming/erasing voltages to the memory cell.

Similarly, the memory cell 222 includes a non-volatile cell M2 and a select transistor M4. The pass transistors M4 and M6 provide the output path for the non-volatile cell M2 to the output terminal Y. The pass transistor M8 provides the electrical path for the programming/erasing voltages to the memory cell.

Table 2 illustrates the operation of the memory cells 221 and 222.

high voltage level. The select M2, ACOL is at high voltage level and BCOL is at 0 V.

To erase the memory cells, TV, SELECT, and CONTROL are at high voltage level. The OUT4 V signal is left open. Both ACOL and BCOL are at 0 V. The X and Y outputs are floating.

In normal operation, the X and Y outputs are the read-out contents of the corresponding memory cells. The TV, SELECT, and CONTROL signals are at 0 V, medium high voltage (MHV), and 4.0 V, respectively. In this embodiment, the MHV is between 9 V to 11 V. Both ACOL and BCOL are at 0 V.

Figure 5:
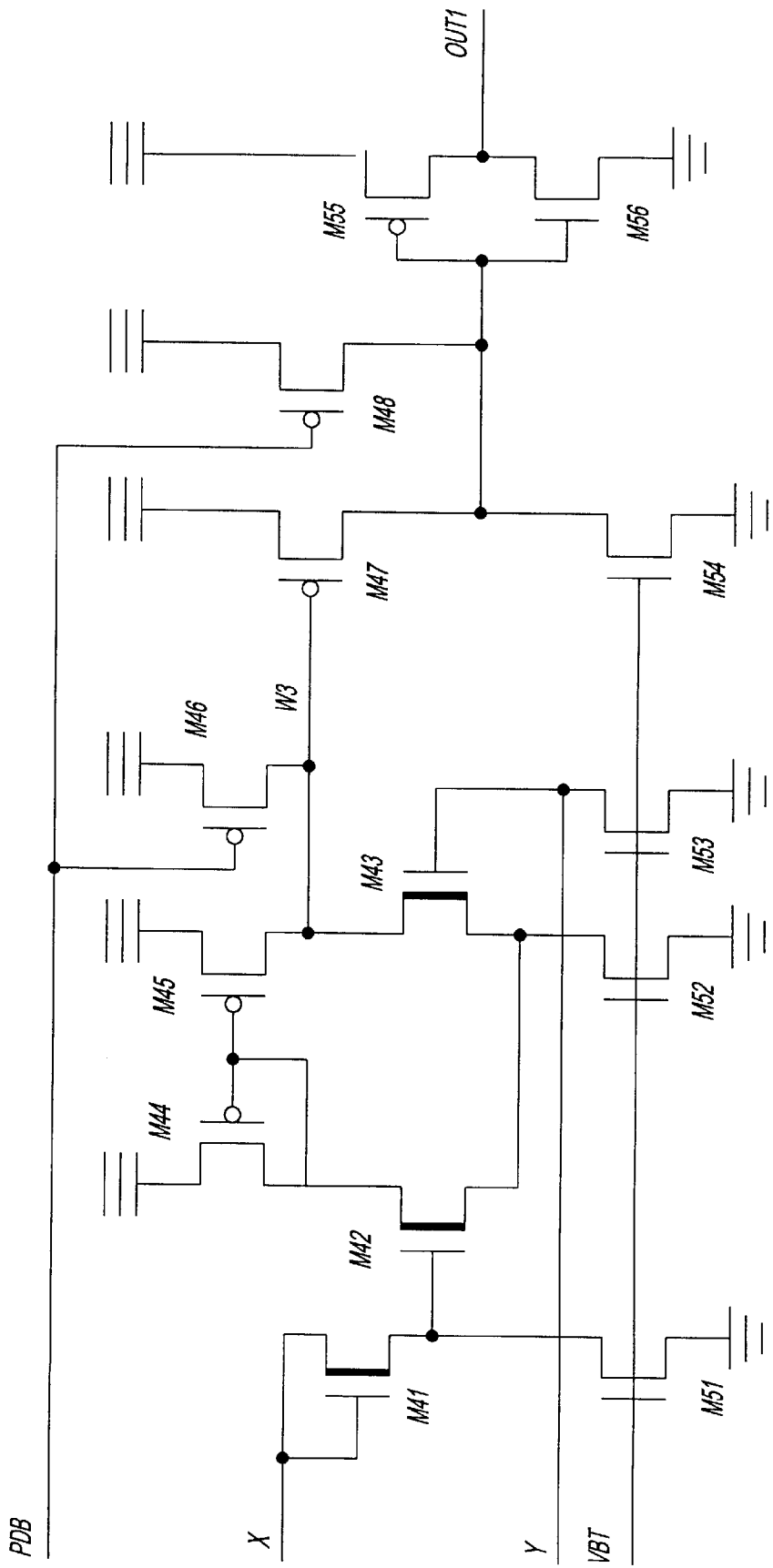
FIG. 5 is a circuit diagram illustrating one embodiment of the differential amplifier.

Referring to FIG. 5, a circuit diagram illustrating one embodiment of the differential sense amplifier (DSA) 251 is shown. DSA 251 includes diode M41, differential pair transistors M42 and M43, load transistors M44 and M45, power down transistors M46 and M48, amplifier transistor M47, current sensor transistors M51, M52, M53 and M54, and inverter output M55 and M56. The DSA 251 receives the two inputs X and Y at its differential terminals, and the two control signals PDB and VBT. The DSA 251 generates the output signal OUT1.

Diode M41 is a native mode transistor-connected diode. Diode M41 is used to introduce a small offset to the gate of M42 to make the output signal OUT1 more deterministic when both cells are in the same condition. The differential transistor pair M42 and M43 are native transistors operating in the differential configuration. The gate of M42 is connected to the diode M41 which introduces a small voltage drop from the X input. The gate of M43 is connected to the Y input. The transistors M44 and M45 provide the normal pull-up load for the differential configuration. The transistors M47 and M54 form an amplifier stage for the output W3 of the differential pair. The transistors M51, M52, M53 and M54 provide current source when the reference voltage VBT is asserted. The transistors M46 and M48 are used in the power down mode to conserve power. When PDB is asserted, M46 and M48 will be turned ON which in turn turn off M47 and M55, reducing the current. The complementary output transistors M55 and M56 work as an inverter/amplifier and produces the output signal OUT1.

The DSA 251 can be configured to work as a single-ended sense amplifier or replaced by a single-ended sense amplifier.

Figure 6:
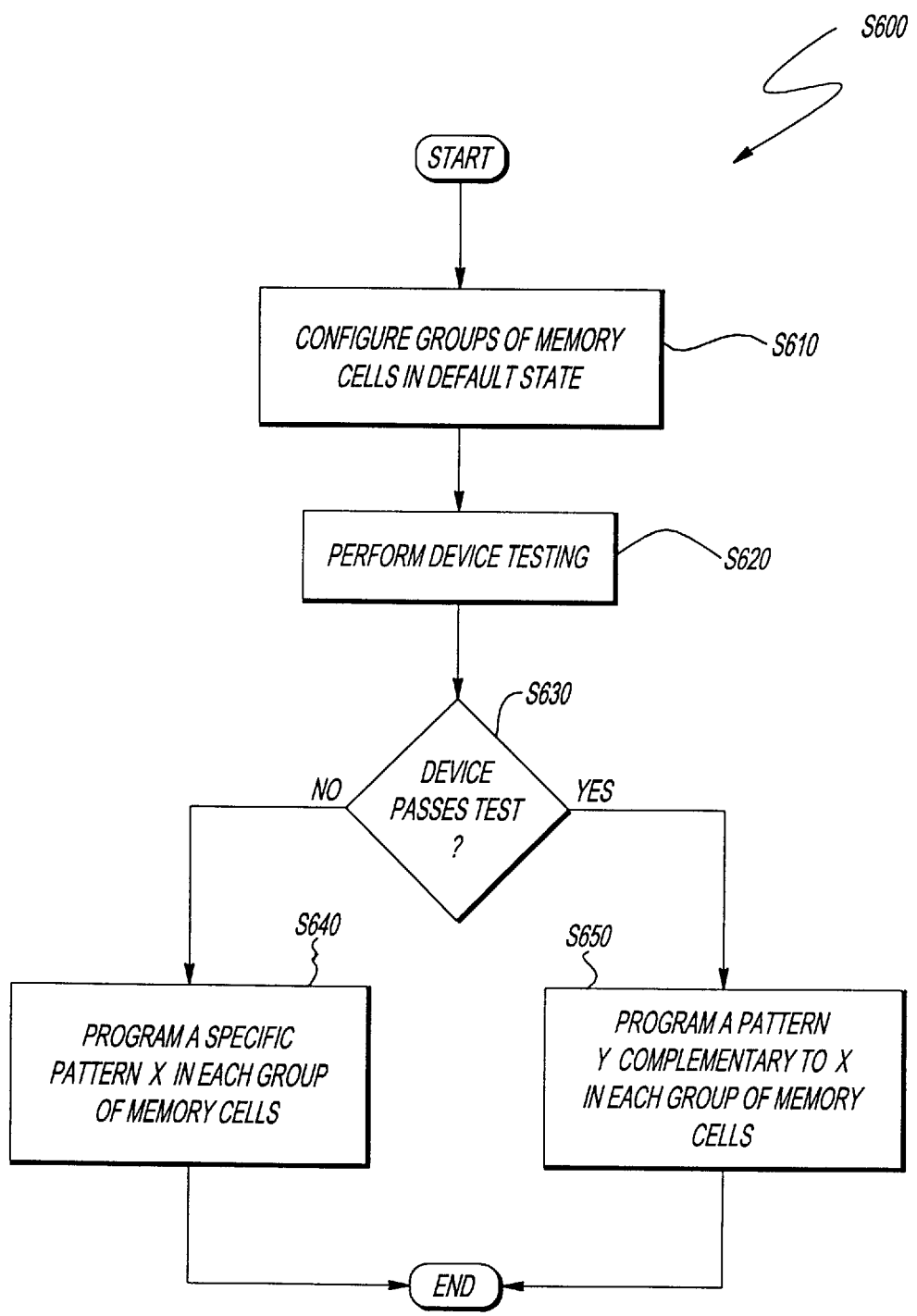
FIG. 6 is a flow chart illustrating a process that operates in accordance with the teaching of the present invention.

Referring to FIG. 6, a flowchart illustrating the process S600 utilizing the teaching of the present invention is shown. Process S600 starts at step S610. At step S610, the

TABLE 2

| Operation | ACOL | BCOL | TV | Select | Control | OUT4V | X | Y |
|---|---|---|---|---|---|---|---|---|
| Program M1 | 0 | HV | HV | HV | 3.5 V | Open | X | X |
| Program M2 | HV | 0 | HV | HV | 3.5 V | Open | X | X |
| Erase M1 and M2 | 0 | 0 | HV | HV | HV | Open | X | X |
| Normal Operation | 0 | 0 | 0 | MHV | 4.0 V | Open | Read-out | Read-out |

To program the memory cells, the TV and SELECT signals are at high voltage (HV) level, the CONTROL signal is at approximately 3.5 V and the OUT4 V signal is left open. In this embodiment, the HV is between 12 V to 16 V. During programming, the X and Y outputs are essentially floating. ACOL and BCOL are used to select the memory cell to be programmed. To select M1, ACOL is at 0 V and BCOL is at tester configures the groups of the non-volatile memory cells in a default state. Normally, the default state is the state where all memory cells are erased. Process S600 then proceeds to step S620. In step S620, the device is tested according to the test sequence by the tester. At the decision step S630, it is determined if the device passes the test.

If the device fails the test program circuit programs a specific pattern X in each group of memory cells. The specific pattern X is selected such that the differential sensing amplifier, or the sensing element, asserts its output only when the pattern matches its normal sensing, e.g. the positive terminal senses a voltage level that is more positive than the negative terminal. This in turn will disable the functional circuit to prevent it from being used. The process S600 is then terminated.

If the device passes the test, the process S600 proceeds to step S650. In step S650, the test program circuit programs a specific pattern Y in each group of memory cells. Preferably, this pattern Y should be complementary to pattern X. The process S600 is then terminated.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A circuit for controlling operation of a functional circuit in a device based on a test result during testing, the circuit comprising:
   a first storage element configured to be in one of a first state and a second state according to said test result; and
   a first sensing element coupled to said first storage element for generating a first signal used to control said operation of said functional circuit.

2. The circuit of claim 1 further comprises:
   a second storage element configured to be in one of the first state and the second state according to said test result, said second storage element being coupled to said first sensing element to allow said generating said first signal.

3. The circuit of claim 1 or claim 2 wherein said first signal controls said operation of said functional circuit when said storage element is in the first state.

4. The circuit of claim 1 or claim 2 further comprises:
   a third storage element configured in one of the first state and the second state according to said test result;
   a second sensing element coupled to said third storage element for generating a second signal; and
   a logic element coupled to the first and second sensing elements to receive said first signal and said second signal to generate a control signal to control said operation of said functional circuit.

5. The circuit of claim 4 further comprises:
   a fourth storage element configured to be in one of the first state and the second state according to said test result, said fourth storage element being coupled to said second sensing element to allow said generating said second signal.

6. The circuit of claim 5 wherein said control signal controls said operation of said functional circuit when said storage elements are configured in the first state.

7. The circuit of claim 6 wherein said storage elements are non-volatile memory cells.

8. The circuit of claim 7 wherein at least one of said first sensing element and said second sensing element is a single-ended sense amplifier.

9. The circuit of claim 7 wherein at least one of said first sensing element and said second sensing element is a differential sense amplifier.

10. A circuit for controlling operation of a functional circuit in a device based on a test result during testing, the circuit comprising:
    a first set of storage elements configured to be in one of N states according to said test result, said N states including one first state and N−1 second states; and
    a first sensing element coupled to said first set for generating a first signal used to control said operation of said functional circuit.

11. The circuit of claim 10 further comprises:
    a second set of storage elements configured to be in one of K states according to said test result, said K states including said first state and K−1 said second states, said second set of storage elements being coupled to said first sensing element to allow said generating said first signal.

12. The circuit of claim 11 further comprises:
    a second sensing element coupled to said K storage elements for generating a second signal; and
    a logic element coupled to said first sensing element and said second sensing element for generating a control signal to control said operation of said functional circuit.

13. The circuit of claim 12 wherein said control signal controls said operation of said functional circuit when said first set and second set are configured in the first state.

14. The circuit of claim 13 wherein said storage elements are non-volatile memory cells.

15. The circuit of claim 13 wherein said first and second sensing elements are differential sense amplifiers.

16. The circuit of claim 10 wherein said first set includes n storage elements and $N=2^n$.

17. The circuit of claim 11 wherein said second set includes k storage elements and $K=2^k$.

18. A method for controlling operation of a function circuit in a device based on a test result during testing, the method comprising the steps of:
    configuring a first set of storage elements in one of N states according to said test result, said N states including one first state and N−1 second states; and
    generating a first signal from a first sensing element, said first signal being used to control said operation of said functional circuit.

19. The method of claim 18 further comprises a step of configuring a second set of storage element in one of K states according to said test result, said K states including said first state and K−1 said second states.

20. The method of claim 19 further comprises a step of generating a second signal from a second sensing element;
    combining said first signal and said second signal by a logic element to generate a control signal; and
    controlling said operation of said functional circuit by said control signal.

21. The method of claim 20 wherein said step of controlling controls said operation of said functional circuit when said first set and second set are configured in the first state.

22. The method of claim 20 wherein said storage elements are non-volatile memory cells.

23. The method of claim 22 wherein said step of configuring includes a step of erasing said non-volatile memory cells.

24. The method of claim 22 wherein said step of configuring includes a step of programming said non-volatile memory cells.

* * * * *